United States Patent
Fuerst et al.

[11] Patent Number: 5,954,536
[45] Date of Patent: Sep. 21, 1999

[54] CONNECTOR FOR FLAT FLEXIBLE CIRCUITRY

[75] Inventors: Robert M. Fuerst, Maple Park; Yves LePottier, Geneva; Russell J. Watt, Chicago, all of Ill.

[73] Assignee: Molex Incorporated, Lisle, Ill.

[21] Appl. No.: 09/049,362

[22] Filed: Mar. 27, 1998

[51] Int. Cl.⁶ .................................................. H01R 9/07
[52] U.S. Cl. ............................ 439/493; 439/496; 439/67
[58] Field of Search .................................. 439/496, 493, 439/67

[56] References Cited

U.S. PATENT DOCUMENTS

| | | | |
|---|---|---|---|
| 3,602,870 | 8/1971 | Willard | 339/17 |
| 3,825,878 | 7/1974 | Finger et al. | 339/17 F |
| 4,531,793 | 7/1985 | Stokoe et al. | 439/55 |
| 4,802,866 | 2/1989 | Balzano et al. | 439/496 |
| 5,163,836 | 11/1992 | Young et al. | 439/67 |
| 5,173,058 | 12/1992 | Broeksteeg et al. | 439/267 |
| 5,306,160 | 4/1994 | Roberts | 439/62 |
| 5,383,788 | 1/1995 | Spencer | 439/67 |
| 5,403,202 | 4/1995 | Roehling | 439/493 |
| 5,529,502 | 6/1996 | Peltier et al. | 439/67 |
| 5,549,479 | 8/1996 | Elco et al. | 439/496 |
| 5,777,855 | 7/1998 | Yokajty | 361/803 |

FOREIGN PATENT DOCUMENTS

WO 97/29526  8/1997  WIPO .......................... H01R 9/07

*Primary Examiner*—Paula Bradley
*Assistant Examiner*—Cecelia Wright Brown
*Attorney, Agent, or Firm*—Stacey E. Caldwell

[57] ABSTRACT

A connector is provided for electrically interconnecting the conductors of a flat flexible circuit to the conductors of a complementary mating connecting device. The connector includes a carrier on which the flexible circuit is positioned with the conductors of the circuit facing away from the carrier. A housing has an opening for receiving the carrier. The carrier is slidably mounted into the opening in the housing to a preliminary loading position for receiving the mating connecting device between the carrier and the housing. The carrier is pivotable from the preliminary loading position to a final connecting position whereat the conductors of the flat circuit are biased against the conductors on the mating connecting device.

20 Claims, 7 Drawing Sheets

CONNECTOR FOR FLAT FLEXIBLE CIRCUITRY

FIELD OF THE INVENTION

This invention generally relates to the art of electrical connectors and, particularly, to connectors for electrically interconnecting flat flexible circuitry.

BACKGROUND OF THE INVENTION

A flat flexible circuit conventionally includes an elongated flat flexible dielectric substrate having laterally spaced strips of conductors on one or both sides thereof. The conductors may be covered with a thin, flexible protective layer on one or both sides of the circuit. If protective layers are used, cutouts are formed therein to expose the underlying conductors at desired contact locations where the conductors are to engage the conductors of a complementary mating connecting device which may be a second flat flexible circuit, a printed circuit board or the terminals of a mating connector.

A wide variety of connectors have been designed over the years for terminating or interconnecting flat flexible circuits with complementary mating connecting devices. Major problems continue to plague such connectors, particularly in the area of cost and reliability. Not only is the direct material costs of such connectors unduly high, but an undue amount of labor time is required in assembling such connectors. The present invention is directed to solving these problems by providing an extremely simple, inexpensive and reliable connector structure not heretofore available.

SUMMARY OF THE INVENTION

An object, therefore, of the invention is to provide a new and improved connector for flat flexible circuitry.

In the exemplary embodiment of the invention, the connector is adapted for electrically interconnecting the conductors of a flat flexible circuit to the conductors of a printed circuit board. The connector includes a male-type flexible circuit carrier defining an edge about which the flat flexible circuit is wrapped with the conductors of the circuit facing away from the carrier. A housing has an opening for receiving the carrier inserted edge-first into the opening. Complementary interengaging guide means are provided between the carrier and the housing for slidably guiding the carrier into the opening in the housing to a preliminary loading position whereat a mouth is defined between the carrier and the housing. The printed circuit board is inserted into the mouth, with the conductors on the board facing the conductors of the flat flexible circuit. Complementary interengaging pivot means are provided between the carrier and the housing when the carrier is in its preliminary loading position. The carrier is pivotally movable from the loading position to a final connecting position whereat the conductors of the flat flexible circuit are biased against the conductors on the printed circuit board.

As disclosed herein, latch means are provided for temporarily holding the carrier in its preliminary loading position. Lock means also are provided for locking the carrier in its final connecting position. The latch means comprise a pair of flexible latch arms at opposite sides of the carrier biased against opposing portions of the housing. The lock means comprise locking flanges on the latch arms engageable behind locking shoulders on the housing.

Another feature of the invention is the provision of locating pegs on the top and bottom of the carrier adapted for insertion into appropriate locating holes in the flat flexible circuit. The locating pegs are positioned on the carrier and therefore provide strain relief for the flexible circuit. The locating pegs on the bottom of the carrier are of sufficient length for insertion also into appropriate locating holes in the printed circuit board. Therefore, both sets of locating pegs perform the functions of locating the flat flexible circuit and of providing strain relief. The bottom locating pegs provide a connector position assurance function as well.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
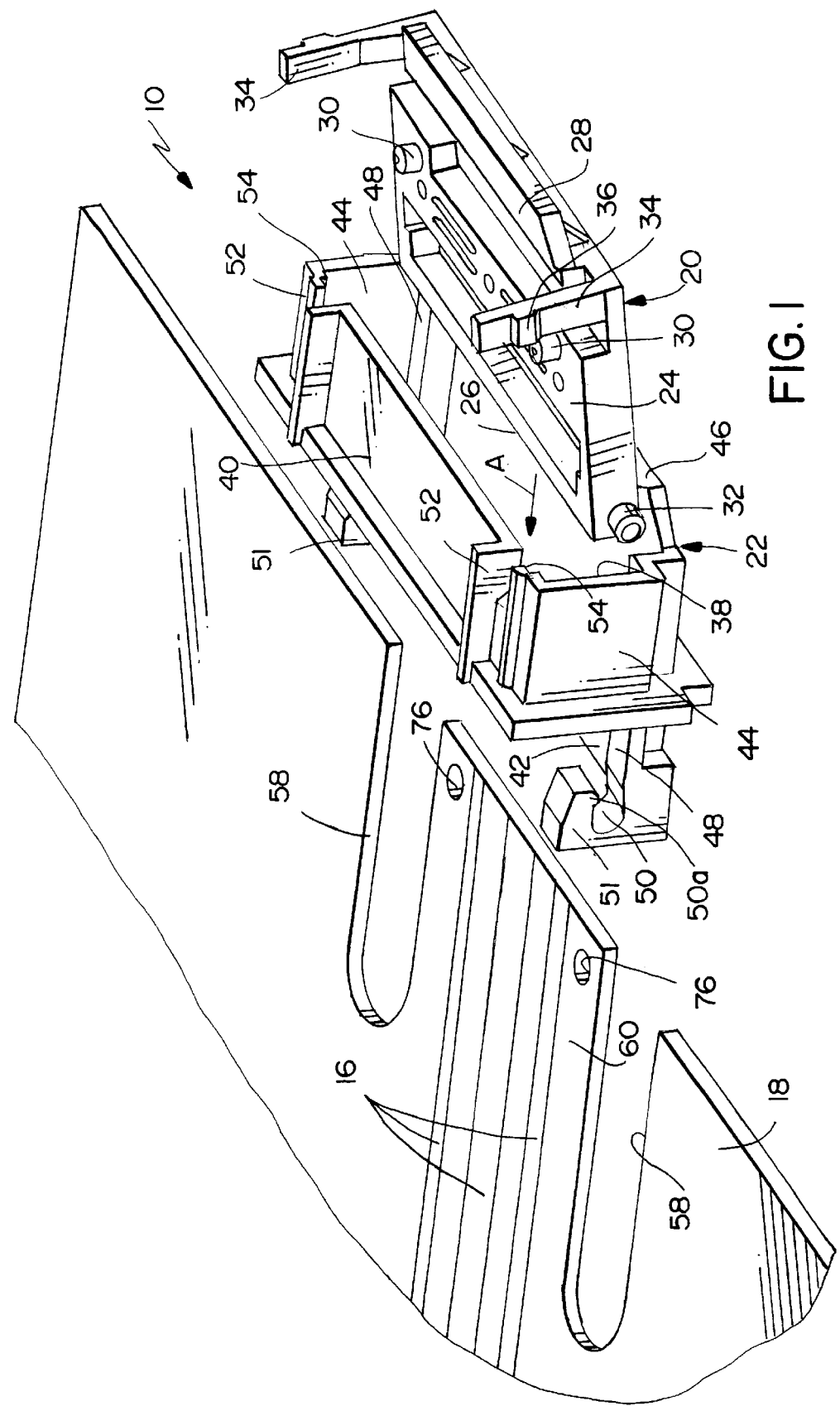
FIG. 1 is a perspective view of a connector embodying the concepts of the invention, in conjunction with a printed circuit board, with the carrier about to be inserted into the housing, and with the flat flexible circuit removed to facilitate the illustration.
Figure 2:
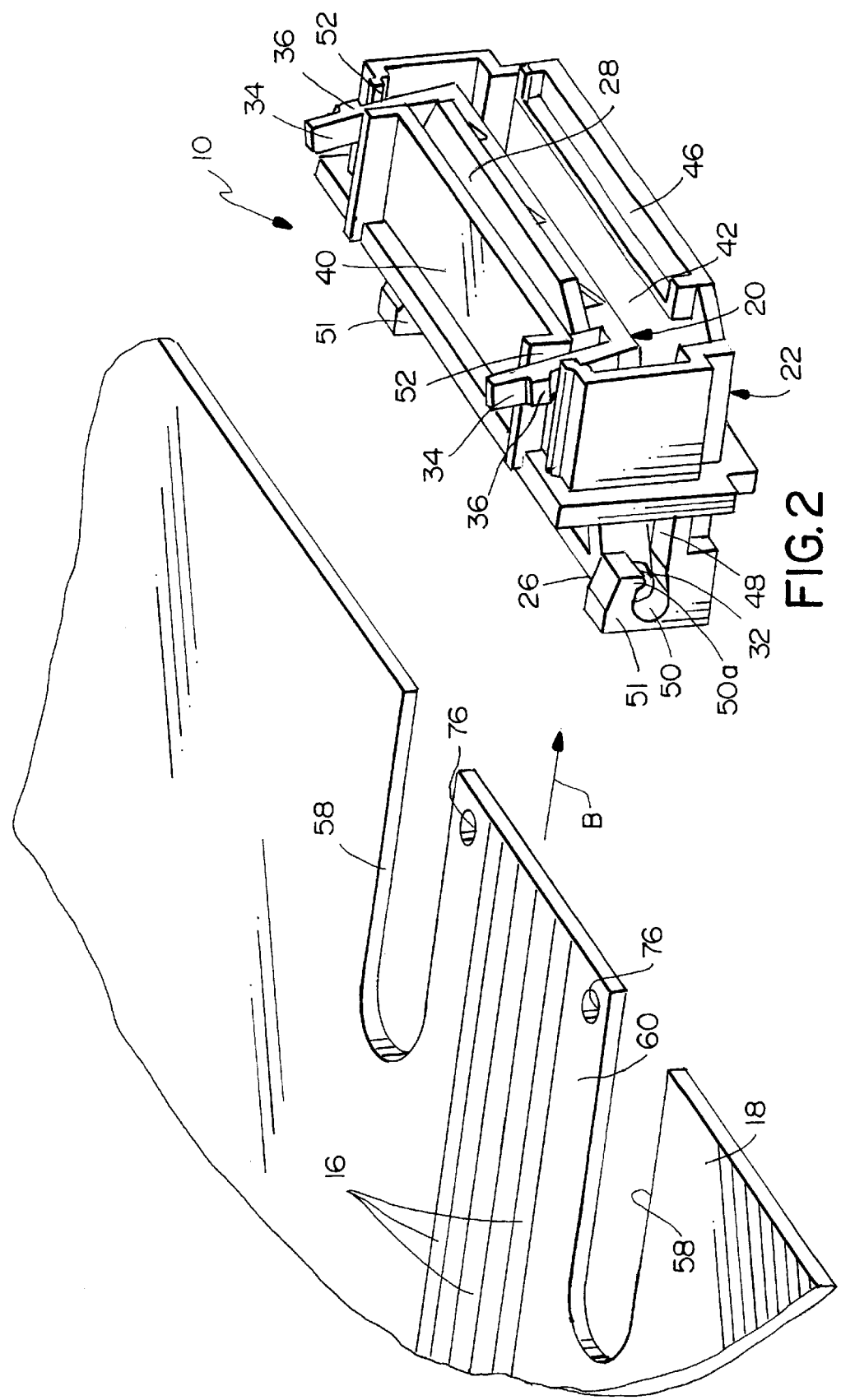
FIG. 2 is a perspective view similar to that of FIG. 1, with the carrier in its preliminary loading position, and again with the flat flexible circuit removed to facilitate the illustration.

Referring to the drawings in greater detail, and first to FIGS. 1–4, the invention is embodied in a connector, generally designated 10, which is adapted for interconnecting the conductors 12 of a flat flexible circuit 14 (FIGS. 3 and 4) to the conductors 16 of a printed circuit board 18 (FIGS. 1 and 2). The connector includes only two components, namely a male-type flexible circuit carrier, generally designated 20, and a housing, generally designated 22. Each of the carrier and the housing is a one-piece structure unitarily molded of dielectric material such as plastic or the like.

Figure 3:
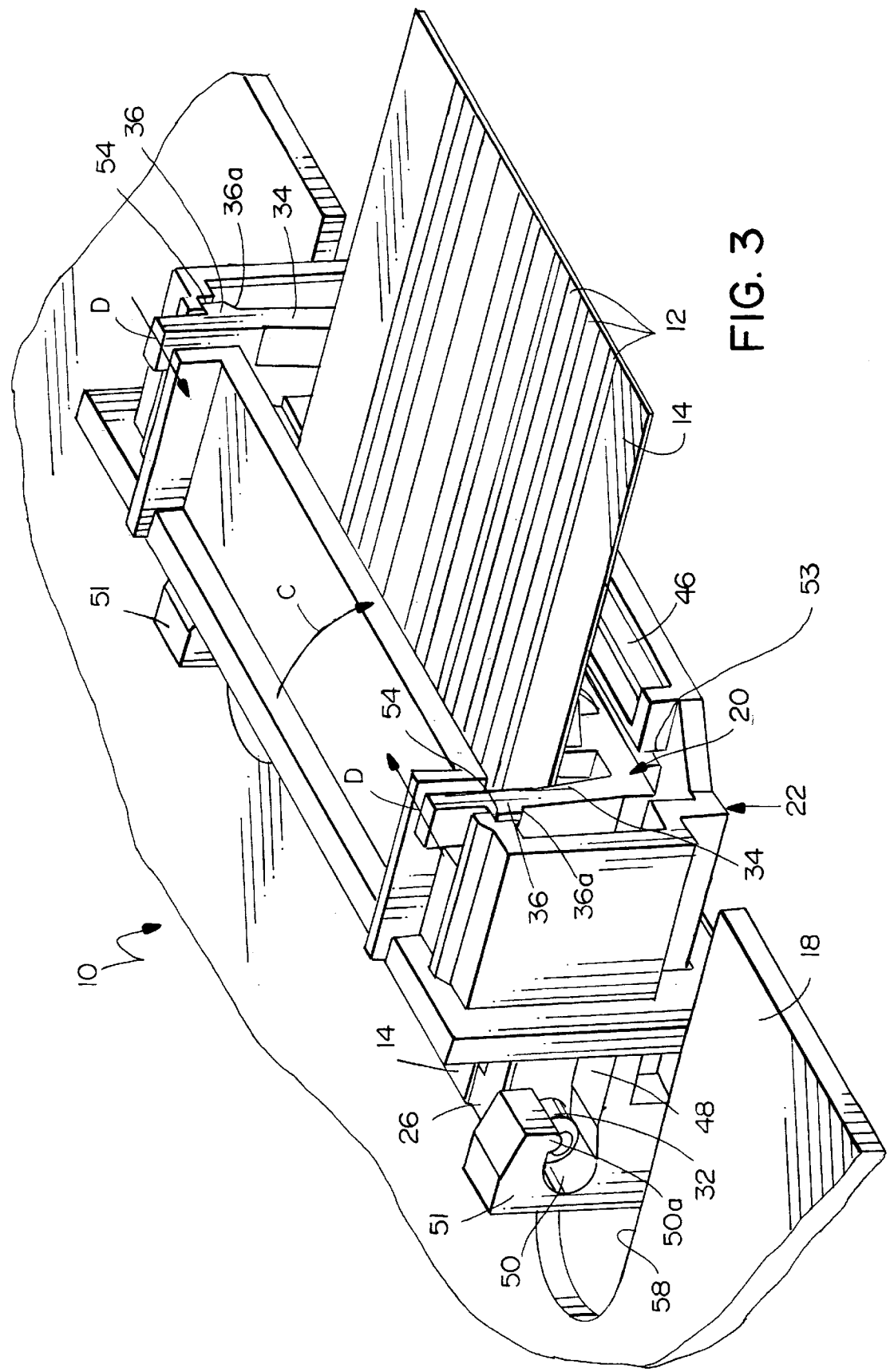
FIG. 3 is a front perspective view of the connector in its final connecting condition interconnecting the conductors of the flat flexible circuit with the conductors of the printed circuit board.
Figure 4:
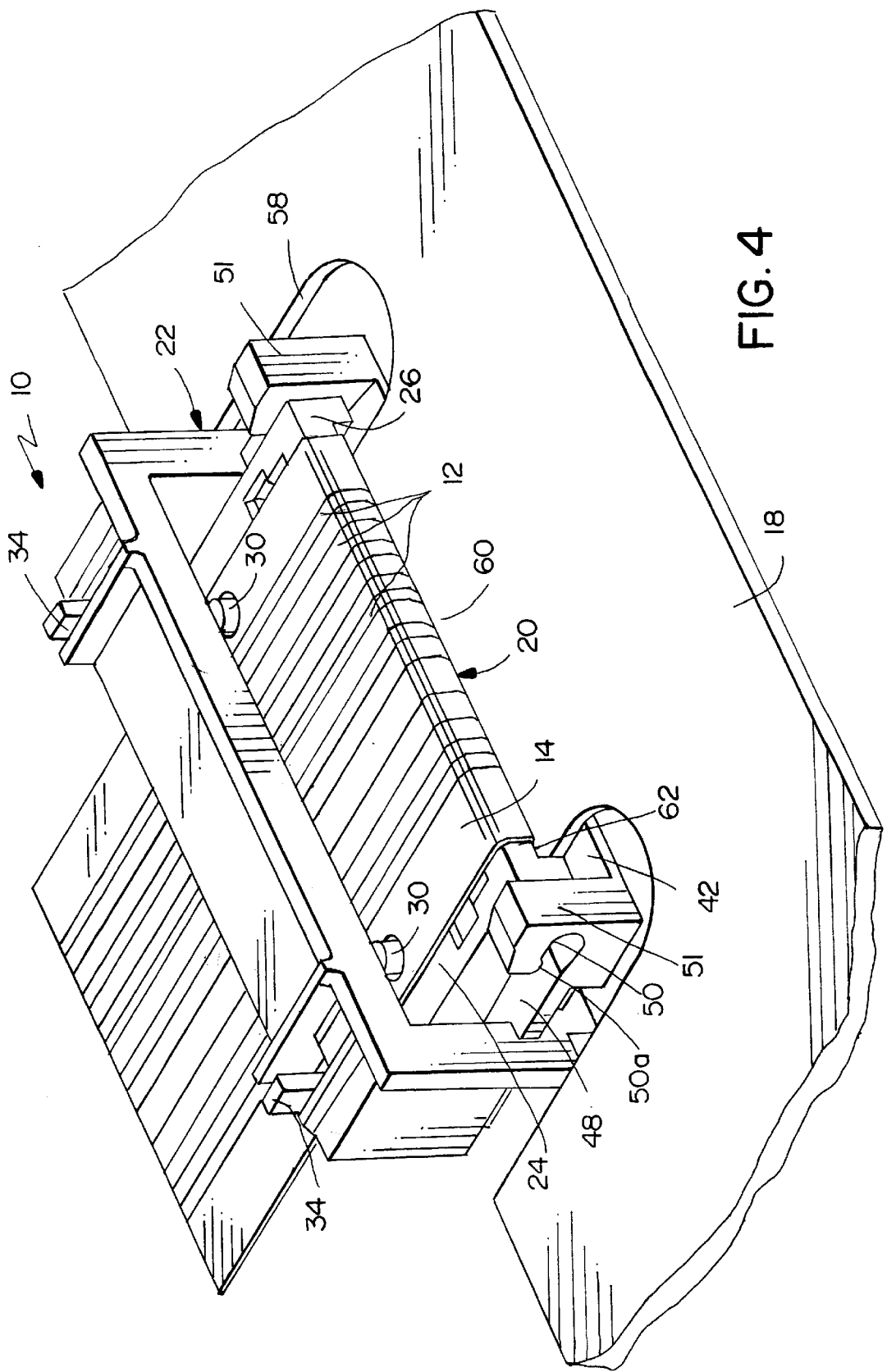
FIG. 4 is a rear perspective view similar to the front perspective view of FIG. 3.

Carrier 20 is shown in FIG. 1 in an inoperative position about to be inserted into housing 22 in the direction of arrow "A". The carrier is shown in FIG. 2 in a latched preliminary loading position whereat printed circuit board 18 is inserted into the connector in the direction of arrow "B". The carrier is shown in FIGS. 3 and 4 in a locked final connecting position whereat the connector has been pivoted downwardly in the direction of arrow "C" (FIG. 3), whereat conductors 12 of flat flexible circuit 14 are biased against conductors 16 of printed circuit board 18. The flat flexible circuit is preliminarily wrapped about carrier 20 before inserting the carrier into the housing, as will be shown clearly hereinafter. However, the flexible circuit has been omitted from FIGS. 1 and 2 to facilitate a clear depiction of the structures of the carrier and the housing as described below.

More particularly, flexible circuit carrier 20 includes a generally flat body 24 defining a front or leading edge 26 and including a rearwardly projecting flange 28. A pair of locating pegs 30 are molded integrally with and project upwardly from body 24, and an additional pair of locating pegs project from the bottom of the body, as will be described hereinafter. A pair of pivot trunnions 32 project outwardly from opposite sides of the body. A pair of flexible latch arms 34 project upwardly from opposite sides of the body near the rear thereof. Finally, a locking flange 36 projects laterally outwardly from each flexible latch arm 34.

Housing 22 is a generally open-ended box-like structure defining an opening 38 through which carrier 20 is inserted in the direction of arrow "A" (FIG. 1). The housing includes a top wall 40, a bottom wall 42 and a pair of side walls 44. Bottom wall 42 extends forwardly beyond the top and bottom walls to define an anvil plate at one side of opening 38 opposite carrier 20 when the carrier is inserted into the housing. A flange 46 projects rearwardly of the bottom wall. A pair of side guide rails 48 are formed inside side walls 44 and extend rearwardly to a pair of pivot sockets 50 formed in a pair of side wings 51 of the housing. Each pivot socket has a lip 50a partially closing the opening to the socket. Top wall 40 is provided with a pair of notches 52 for receiving flexible latch arms 34 of carrier 20. The notches define locking shoulders 54 on the outside of the notches for engaging locking flanges 36 on the outsides of the flexible latch arms.

When carrier 20 is inserted through opening 38 in housing 22 in the direction of arrow "A", guide rails or slots 48 on the housing cooperate with pivot trunnions 32 on the carrier to provide a complementary interengaging guide means for slidably guiding the carrier through the opening in the housing to the preliminary loading position of the carrier as seen in FIG. 2. When the carrier moves to the loading position, flexible latch arms 34 move into notches 52 of the housing as is seen clearly in FIG. 2. In this preliminary loading position of the carrier, pivot trunnions 32 are seated within pivot sockets 50, also as seen in FIG. 2. The carrier is held in this preliminary loading position by the outward biasing engagement of flexible latch arms 34 within notches 52, and the carrier cannot move toward its final position because of the engagement of locking flanges 36 on the outside of the latch arms with the top of the housing at the outside edges of the notches.

With carrier 20 in its preliminary loading position as shown in FIG. 2 (and assuming the flat flexible circuit is wrapped around the carrier), printed circuit board 18 is inserted into the connector in the direction of arrow "B" (FIG. 2). The circuit board includes a pair of cutouts 58 which define a tongue portion 60 on which conductors 16 are disposed. The cutouts accommodate side wings 51 of housing 22, and tongue portion 60 is inserted into a mouth 62 which is visible in FIG. 4. The mouth is defined between carrier 20 and housing bottom wall 42 which defines an anvil plate of the housing.

After printed circuit board 18 is inserted into connector 10, carrier 20 is pivoted downwardly relative to housing 22 by the complementary interengaging pivot means provided by pivot trunnions 32 of the carrier seated within pivot sockets 50 of the housing. The carrier is pivoted downwardly in the direction of arrow "C" (FIG. 3). As best seen in FIG. 2, rear flange 28 of the carrier and rear flange 46 of the housing can be gripped between the fingers of an operator to pivot the carrier to its final connecting position. As best seen in FIG. 3, bottom edges 36a of locking flanges 36 are angled or chamfered so that flexible latch arms 34 are biased inwardly in the direction of arrows "D" as the carrier is pivoted to its final connecting position. When the carrier reaches its final position, the abrupt top edges of locking flanges 36 resiliently snap back outwardly, opposite the direction of arrows "D" into locking engagement behind shoulders 54 of the housing. When in its final connecting position, carrier 20 biases conductors 12 of flat flexible circuit 14 against conductors 16 of printed circuit board 18. Lips 50a at the entrances to sockets 50, along with or in addition to wall 53 prevent the carrier from pulling out of the housing as pivot trunnions 32 are biased upwardly in the sockets.

Figure 5:
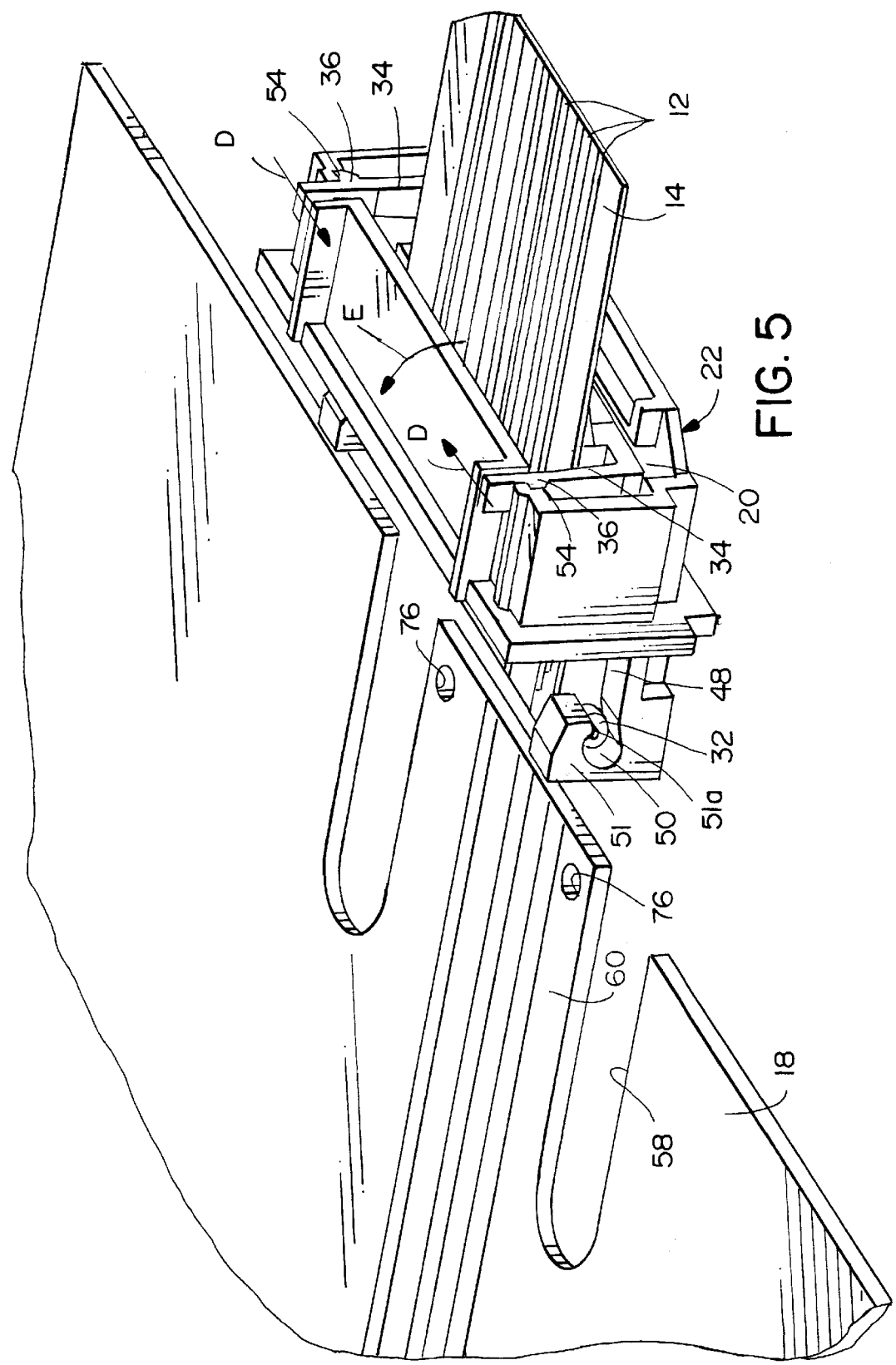
FIG. 5 is a perspective view of the connector with the flexible circuit mounted therein, but with the circuit board removed, as when the connector and flexible circuit are in transit.

If it is necessary to remove printed circuit board 18 from connector 10, the distal ends of flexible latch arms 34 are pinched by an operator's fingers in the direction of arrows "D" (FIG. 3), and the carrier is lifted back to its preliminary loading position (FIG. 2) to release the printed circuit board. This structural combination also allows for the connector and flexible circuit to be assembled as a subassembly and subsequently opened to receive a printed circuit board on site, for instance. This is shown in FIG. 5. Again, flexible latch arms 34 are pinched inwardly in the direction of arrows "D" to clear locking flanges 36 from behind locking shoulders 54. The carrier then is lifted in the direction of arrow "E", and the tongue portion 60 of the printed circuit board can be inserted into the connector on site.

Figure 6:
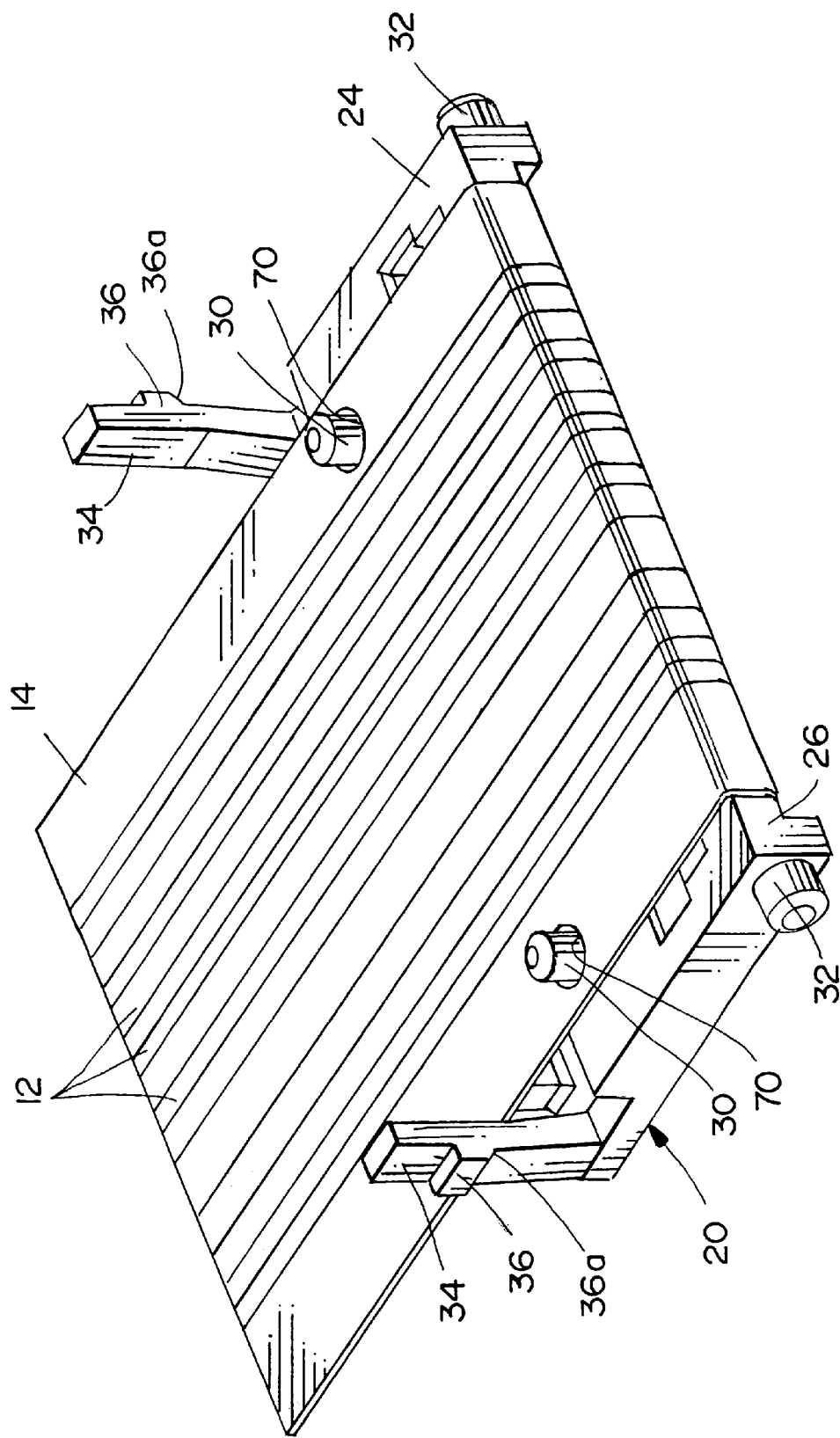
FIG. 6 is a top perspective view of the carrier with the flat flexible circuit mounted thereon.
Figure 7:
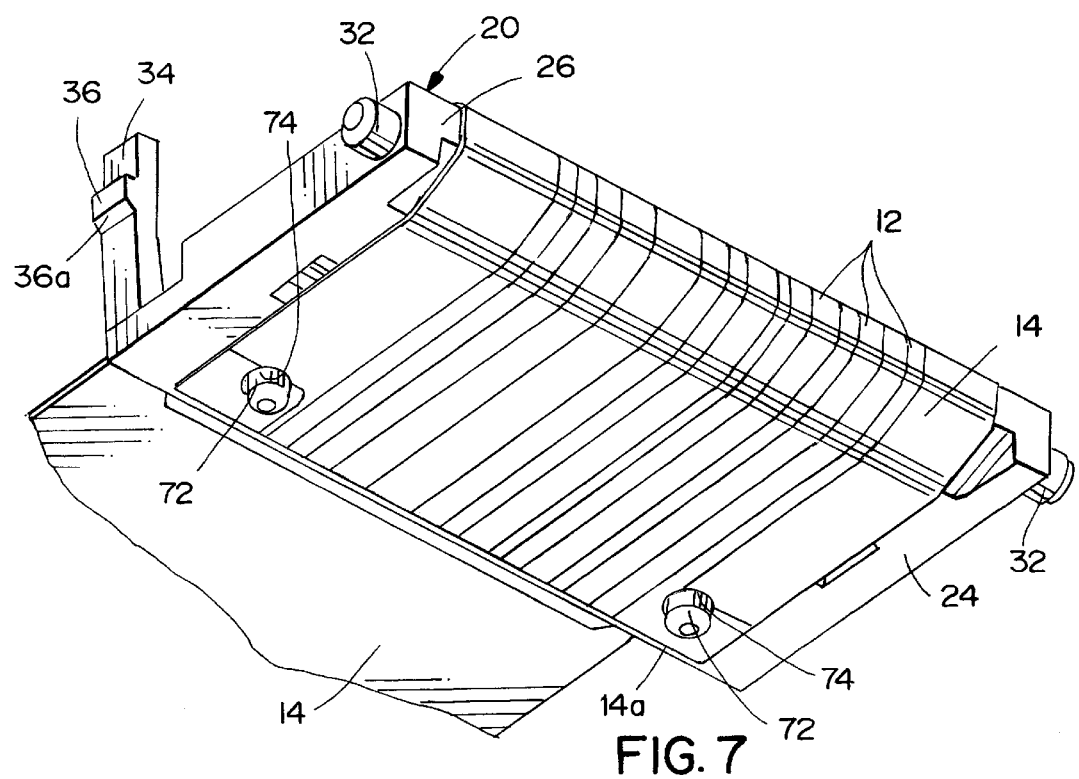
FIG. 7 is a bottom perspective view similar to the top perspective view of FIG. 6.

FIGS. 6 and 7 show how flat flexible circuit 14 is wrapped around the front or leading edge 26 of carrier 20. In FIG. 6, the top pair of locating pegs 30 project through a pair of holes 70 near opposite edges of the flat flexible circuit. When the circuit is wrapped around the carrier, conductors 12 of the circuit face away or outwardly from the carrier. In addition to locating the flexible circuit on the carrier, the pegs also provide an integral strain relief for the flexible circuit itself. FIG. 7 shows a second pair of locating pegs 72 molded integrally with and projecting downwardly from body 24 of the carrier for insertion into a pair of locating holes 74 near opposite corners of a leading or free end 14a of flat flexible circuit 14. Locating pegs 72 also provide strain relief for flexible circuit 14.

Figure 8:
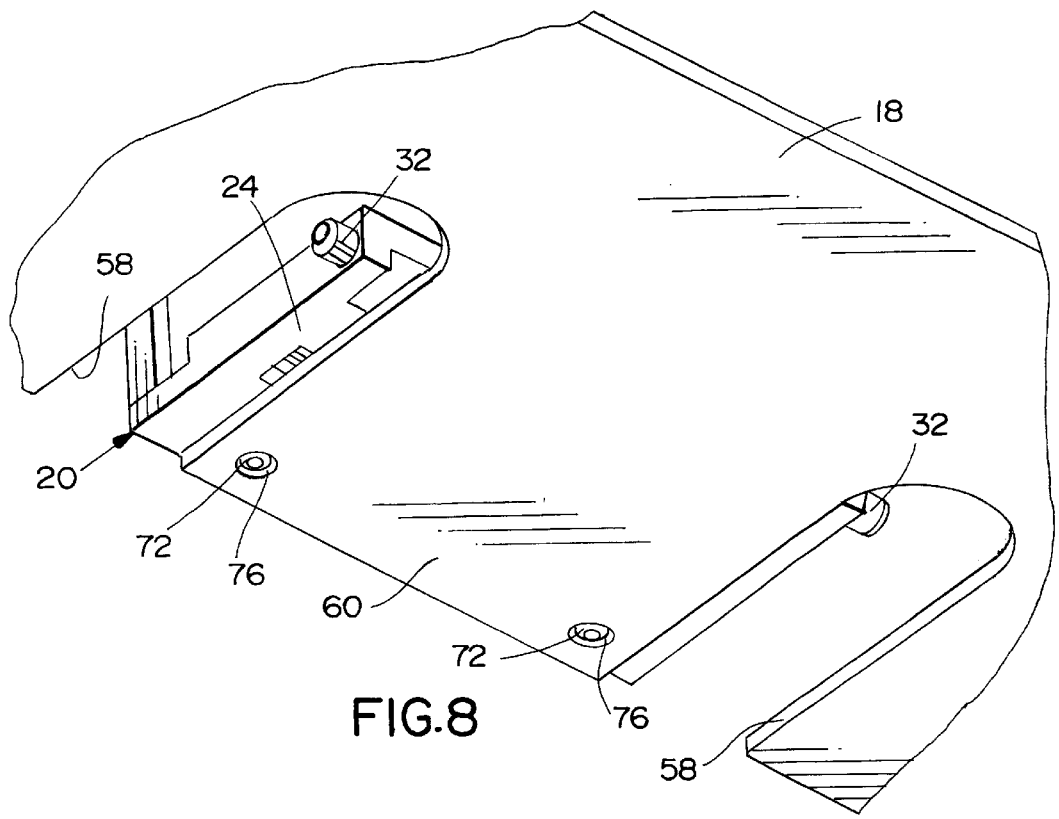
FIG. 8 is a bottom perspective view of the printed circuit board in conjunction with the carrier.

Finally, FIG. 8 shows a feature of the invention wherein the pair of locating pegs 72 which project downwardly from body 24 of carrier 20 are adapted to be inserted into a pair of locating holes 76 in printed circuit board 18 upon rotation of carrier 20. That is, when the carrier reaches its final position and locking flanges 36 are in locking engagement behind shoulders 54, locating pegs 72 will move into locating holes 76. If the carrier is not properly aligned relative to circuit board 18, the carrier will not completely rotate inasmuch as pegs 72 will interfere with the surface of printed circuit board 18. Thus the locating pegs also act as a connector position assurance since the carrier cannot be locked into place if pegs 72 are not aligned with holes 76. Furthermore, locating pegs 72 are of sufficient length to accommodate both the flat flexible circuit and the printed circuit board, thereby performing the functions of locating and positioning both the flexible circuit and the circuit board.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A connector for electrically interconnecting the conductors of a flat flexible circuit to the conductors of a printed circuit board, comprising:

a male-type flexible circuit carrier defining an edge about which the flat flexible circuit is wrapped with the conductors of the circuit facing away from the carrier;

a housing having an opening for receiving the carrier inserted edge-first thereinto;

complementary interengaging guide means between the carrier and the housing for slidably guiding the carrier into the opening in the housing to a preliminary loading position whereat a mouth is defined between the carrier and the housing for receiving the printed circuit board thereinto with the conductors on the board facing the conductors of the flat flexible circuit; and complementary interengaging pivot means between the carrier and the housing when the carrier is in said preliminary loading position for pivoting the carrier from the loading position to a final connecting position whereat the conductors of the flat flexible circuit are biased against the conductors on the printed circuit board.

2. The connector of claim 1 wherein said housing includes an anvil plate on a side of said mouth opposite the carrier whereby the printed circuit board is sandwiched between the anvil plate and the carrier.

3. The connector of claim 1 wherein said carrier includes at lease one locating peg adapted for insertion into an appropriate locating hole in the flat flexible circuit.

4. The connector of claim 3 wherein said locating pegs are positioned on the carrier and are of sufficient length for insertion also into appropriate locating holes in the printed circuit board.

5. The connector of claim 1 wherein said carrier includes at least one locating peg adapted for insertion into an appropriate locating hole in the printed circuit board.

6. The connector of claim 1, including lock means for locking the carrier in its final connecting position.

7. The connector of claim 1, including latch means for temporarily holding the carrier in its preliminary loading position.

8. The connector of claim 7 wherein said latch means comprise a pair of flexible latch arms at opposite sides of the carrier biased against opposing portions of the housing.

9. The connector of claim 7, including lock means for locking the carrier in its final connecting position.

10. The connector of claim 9 wherein said latch means comprises a pair of flexible latch arms at opposite sides of the carrier biased against opposing portions of the housing, and said lock means comprise locking flanges on the latch arms engageable behind locking shoulders on the housing.

11. A connector for electrically interconnecting the conductors of a flat circuit to the conductors of a complementary mating connecting device, comprising:

a circuit carrier on which the flat circuit is positioned with the conductors on the circuit facing away from the carrier;

a housing having an opening for receiving the carrier thereinto;

complementary interengaging guide means between the carrier and the housing for slidably guiding the carrier into the opening in the housing to a preliminary loading position for receiving the mating connecting device with the conductors on the device facing the conductors of the flat circuit; and complementary interengaging pivot means between the carrier and the housing when the carrier is in said preliminary loading position for pivoting the carrier from the loading position to a final connecting position whereat the conductors of the flat circuit engage the conductors on the connecting device.

12. The connector of claim 11 wherein said housing includes an anvil plate opposite the carrier whereby the connecting device is sandwiched between the anvil plate and the carrier.

13. The connector of claim 11 wherein said carrier includes locating pegs adapted for insertion into appropriate locating holes in the flat circuit.

14. The connector of claim 13 wherein said locating pegs are positioned on the carrier and are of sufficient length for insertion also into appropriate locating holes in the mating connecting device.

15. The connector of claim 11 wherein said carrier includes locating pegs adapted for insertion into appropriate locating holes in the mating connecting device.

16. The connector of claim 11, including lock means for locking the carrier in its final connecting position.

17. The connector of claim 11, including latch means for temporarily holding the carrier in its preliminary loading position.

18. The connector of claim 17 wherein said latch means comprise a pair of flexible latch arms at opposite sides of the carrier biased against opposing portions of the housing.

19. The connector of claim 17, including lock means for locking the carrier in its final connecting position.

20. The connector of claim 19 wherein said latch means comprises a pair of flexible latch arms at opposite sides of the carrier biased against opposing portions of the housing, and said lock means comprise locking flanges on the latch arms engageable behind locking shoulders on the housing.

* * * * *